(12) United States Patent
Yang

(10) Patent No.: US 9,040,410 B2
(45) Date of Patent: May 26, 2015

(54) FABRICATION METHOD FOR SEMICONDUCTOR DEVICE AND SEMICONDUCTOR DEVICE

(71) Applicant: CSMC Technologies Fab2 Co., Ltd., Wuxi, Jiangsu (CN)

(72) Inventor: Xin Yang, Wuxi (CN)

(73) Assignee: CSMC Technologies Fab2 Co., Ltd., Wuxi, Jiangsu (CN)

( * ) Notice: Subject to any disclaimer, the term of this patent is extended or adjusted under 35 U.S.C. 154(b) by 0 days.

(21) Appl. No.: 14/130,482

(22) PCT Filed: May 10, 2013

(86) PCT No.: PCT/CN2013/075453
§ 371 (c)(1),
(2) Date: Dec. 31, 2013

(87) PCT Pub. No.: WO2013/170725
PCT Pub. Date: Nov. 21, 2013

(65) Prior Publication Data
US 2014/0145354 A1   May 29, 2014

(30) Foreign Application Priority Data
May 15, 2012   (CN) .......................... 2012 1 0152215

(51) Int. Cl.
H01L 23/544 (2006.01)
G03F 7/20 (2006.01)
G03F 9/00 (2006.01)
H01L 21/00 (2006.01)

(52) U.S. Cl.
CPC ............... H01L 23/544 (2013.01); G03F 7/20 (2013.01); G03F 9/708 (2013.01); H01L 21/00 (2013.01); H01L 2223/54433 (2013.01); H01L 2223/54453 (2013.01)

(58) Field of Classification Search
USPC .......................... 438/622, 631, 633, 761, 975
See application file for complete search history.

(56) References Cited

U.S. PATENT DOCUMENTS

| | | | | |
|---|---|---|---|---|
| 5,801,090 | A * | 9/1998 | Wu et al. ........................ | 438/622 |
| 6,329,301 | B1 * | 12/2001 | Zahorik et al. ................. | 438/745 |
| 6,649,077 | B2 * | 11/2003 | Tsai et al. ....................... | 216/92 |

\* cited by examiner

Primary Examiner — Roy Potter
(74) Attorney, Agent, or Firm — Han IP Corporation

(57) ABSTRACT

A fabrication method for semiconductor devices is provided. The method comprises: depositing a dielectric layer that includes a plurality of functional layers, and forming a contact hole, or through hole, and a metal layer. The forming of the contact hole, or through hole, and the metal layer comprises performing photolithography on regions corresponding to a marking label for the photolithography of the dielectric layer and the metal layer. On at least one of the functional layers, the performing photolithography on regions corresponding to a marking label for the photolithography comprises limiting the photolithography to the metal layer thereof. A semiconductor device thus fabricated is also provided. The method and device do not affect the reading of the marking label, and also can avoid the problem of defocusing in the vicinity of the marking label.

11 Claims, 1 Drawing Sheet

US 9,040,410 B2

FABRICATION METHOD FOR SEMICONDUCTOR DEVICE AND SEMICONDUCTOR DEVICE

CROSS REFERENCE TO RELATED APPLICATIONS

This application is the U.S. national phase application of International application number PCT/CN2013/075453, filed on 10 May 2013, which claims the priority benefit of China Patent Application No. 201210152215.6, filed on 15 May 2012, which is hereby incorporated by reference in its entirety.

TECHNICAL FIELD

The present disclosure is related to semiconductor technology and, more particularly, to a fabrication method of semiconductor devices and a semiconductor device thereof.

BACKGROUND

During the fabrication of semiconductor, especially the process of photolithography on wafers, wafers are labeled with markings in order to identify and distinguish wafers. The marking may be done by ink labeling or laser labeling on the front side or back side of a wafer, but markings on the back side of the wafer tend to be worn off and become unreadable. Thus, labeling markings on the front side of wafers is a better solution.

As markings are labeled on the front side of wafers, conventional techniques typically perform photolithography for the markings during the photolithography of each layer. The thickness of the wafer in areas in the vicinity of the marking tends to become uneven after processes of photolithography and washing for subsequent layers. When the same mask is used for photolithography, the pattern projected unto that region tends to be defocused, resulting in high tendency of failure in the chips made from around that region of the wafer.

A conventional approach is to trim the scope of exposure of photolithography for the marking so that it is closer to the edge of the wafer in order to reduce the area of defocusing. Nevertheless this approach does not completely solve the problem of defocusing.

SUMMARY

Therefore, there is a need to provide a fabrication method for semiconductor devices that reduces defocusing.

A fabrication method for semiconductor devices may comprise: depositing a dielectric layer that includes a plurality of functional layers; and forming a contact hole, or a through hole, and a metal layer. The forming may comprise performing photolithography on regions corresponding to a marking label for the photolithography of the dielectric layer and the metal layer. On at least one of the functional layers, the performing photolithography on regions corresponding to a marking label for the photolithography may comprise limiting the photolithography to the metal layer thereof.

In one embodiment, performing the photolithography on the metal layer may comprise performing the photolithography on at least two of the plurality of functional layers including at least an outermost layer and a neighboring layer of the plurality of functional layers.

A semiconductor device may comprise: a silicon substrate having a marking label; a silicon oxide layer on the silicon substrate; a metal layer on the silicon oxide layer; and a plurality of functional layers on the metal layer, each of the plurality of functional layers respectively including a dielectric layer and a metal layer that are sequentially stacked. A region of the metal layer of at least one of the plurality of functional layers corresponding to the marking label may be photoetched by photolithography.

In one embodiment, the at least one of the plurality of functional layers may comprise at least an outermost layer and a neighboring layer of the plurality of functional layers.

In the aforementioned method and device, as only the metal layer of at least two of the functional layers is photoetched by photolithography, the thickness of the corresponding dielectric layer is maintained. This results in the reduction in the degree of thinning of the device, thus reducing defocusing.

DETAILED DESCRIPTION OF THE PREFERRED EMBODIMENTS

Figure 1:
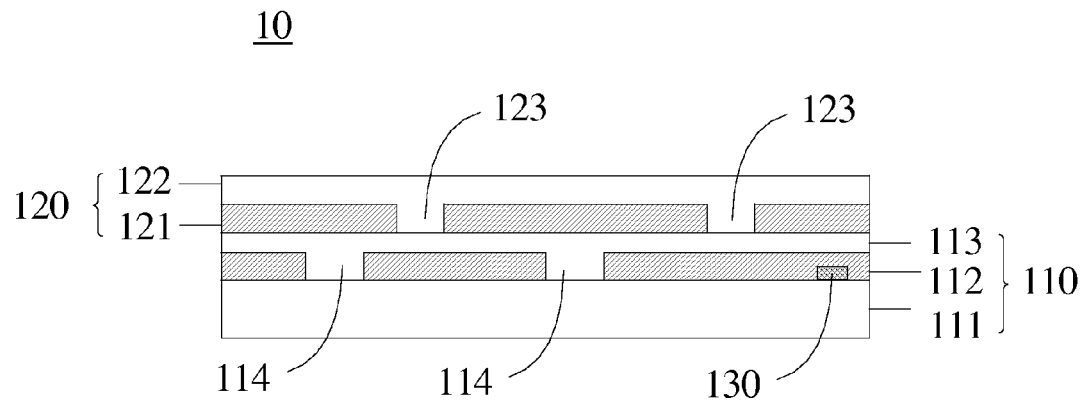
FIG. 1 is a diagram of a cross-sectional view of a semiconductor device of a two-layer interconnect structure.

FIG. 1 shows a cross-sectional view of a semiconductor device of a two-layer interconnect structure. The semiconductor device 10 includes a first layer 110 and a second layer 120 that are sequentially stacked. The first layer 110 and the second layer 120 are interconnected.

The first layer 110 includes a silicon substrate 111, a silicon oxide layer 112 formed on the surface of the silicon substrate 111, and a first metal layer 113 formed on the silicon oxide layer 112. The silicon oxide layer 112 includes a plurality of contact holes 114 in which a metal is filled during a metallization process, so that the first metal layer 113 and the silicon substrate 111 are electrically coupled together. The silicon substrate 111 includes a marking 130. The marking 130 may include a plurality of markings and may be disposed around an outer rim of the wafer.

The second layer 120 includes a first dielectric layer 121 formed on the first metal layer 113 and a second metal layer 122 formed on the first dielectric layer 121. The first dielectric layer 121 includes a plurality of vias 123 in which a metal is filled during a metallization process, so that the second metal layer 122 and the first metal layer 113 are electrically coupled together.

For semiconductor devices with more layers, additional dielectric layers and additional metal layers may be formed on the second layer 120, before forming a protective layer thereon.

A fabrication method of semiconductor devices is provided. The method includes forming the above-described first layer 110 and second layer 120 or process for forming additional steps. The first layer 110, the second layer 120 or additional layers are referred to as functional layers. Each of the functional layers forms the basic structure of the semiconductor device.

The first layer 110 does not include a dielectric layer. The silicon oxide layer 112 is formed on the surface of the silicon substrate 111 by processes such as thermal oxidation. Thereafter, contact holes 114 are formed on the silicon oxide layer 112 by photolithography, and metallization is performed to form the first metal layer 113.

As for the second layer 120, or additional layers that follow, which includes a dielectric layer (i.e., the first dielectric layer 121 regarding the second layer 120), the dielectric layer is first deposited and vias 123 are formed in the dielectric layer by photolithography. Metallization is then performed to form the second metal layer 122.

According to the above-described process, except for the first layer 110, the formation of each other layer includes the processes of deposition of the dielectric layer, formation of the vias, and formation of the metal layer.

In order to ensure the readability of the marking 130, regions in the dielectric layer or metal layer corresponding to the marking 130 need to be exposed for photolithography.

In one embodiment, the photolithography of the regions in the dielectric layer or metal layer corresponding to the marking 130 is limited to only the metal layer. That is, when forming patterns in the metal layer, the region in the metal layer corresponding to the marking 130 is also processed for photolithography so that marking 130 is not blocked by the metal layer.

In a preferred embodiment, multiple outer layers, such as the outermost layer and its immediate neighboring layer of the plurality of functional layers, are chosen for this process. The other layers are processed according to the conventional approach in that the regions in both the dielectric layer and metal layer corresponding to the marking 130 are exposed for photolithography. The preferred embodiment can balance the contradiction between providing readable marking 130 and thinning of the silicon substrate 111 around the vicinity of the marking 130. That is, the accurate readability of the marking 130 is satisfied to a great extent while the thinning of the semiconductor device is minimized.

Of course, there are other methods to choosing the functional layer the metal layer of which is processed by photolithography, such as choosing every other layer. The location and number of the chosen layers may depend on experiments and are not limited to the method described above.

Figure 2:
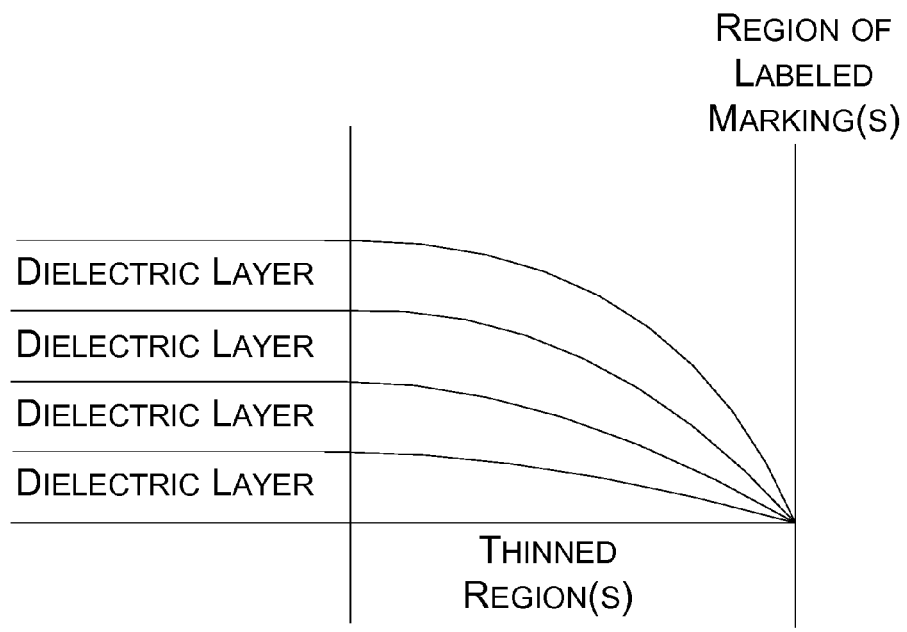
FIG. 2 is a diagram showing the principle of thinning of a device in the region in the vicinity of a marking.

FIG. 2 shows the principle of thinning of a device in the region in the vicinity of a marking. Regions of multiple dielectric layers that correspond to the marking will become thinner after photolithography, and the accumulated thickness of the device is therefore decreased. As shown in the figure, the thickness can be maintained if the dielectric layers are not processed by photolithography. Thus, the benefit of the present embodiment is apparent. As the dielectric layers are transparent, the effect on the readability of the marking is small even when multiple dielectric layers are stacked together.

A semiconductor device fabricated in accordance with the above-described method has a number of features as follows: For at least one of the plurality of functional layers, photolithography is limited to the region of the metal layer thereof that corresponds to the marking. Preferably, the at least one of the plurality of functional layers includes two outermost layers of the plurality of functional layers.

The possibility of failure of such semiconductor device is relatively small.

The above-described embodiments represent select few examples of implementation. The description thereof is detailed but is not to be construed as limiting the scope of the invention of the present disclosure. Rather, those with ordinary skill in the art may derive various modifications and improvements of the present disclosure without deviating from the concept of the present disclosure. For example, the single-well design of the disclosed electrostatic discharge protection structure may be replaced with a double-well design. Such variations are within the protective scope of the present disclosure. Therefore, the protective scope of the present disclosure is to be determined based on the attached claims.

What is claimed is:

1. A fabrication method for semiconductor devices, comprising:
   providing a substrate that includes at least one marking label on a primary surface of the substrate;
   depositing a plurality of functional layers over the primary surface of the substrate, each functional layer of the plurality of functional layers respectively comprising a dielectric layer and a metal layer disposed on the dielectric layer; and
   performing photolithography on regions of each of at least two functional layers of the plurality of functional layers corresponding to the at least one marking label.

2. The fabrication method for semiconductor devices of claim 1, wherein performing the photolithography on regions of each of at least two functional layers of the plurality of functional layers corresponding to the at least one marking label comprises performing the photolithography on regions of at least an outermost layer and a neighboring layer of the plurality of functional layers corresponding to the at least one marking label.

3. A semiconductor device, comprising:
   a silicon substrate having at least one marking label on a primary surface of the silicon substrate;
   a silicon oxide layer on the primary surface of the silicon substrate;
   a metal layer on the silicon oxide layer;
   a plurality of functional layers on the metal layer, each of the plurality of functional layers respectively including a dielectric layer and a metal layer that are sequentially stacked,
   wherein a region of the metal layer of at least one of the plurality of functional layers corresponding to the at least one marking label is photoetched by photolithography.

4. The semiconductor device of claim 3, wherein the at least one of the plurality of functional layers comprises at least an outermost layer and a neighboring layer of the plurality of functional layers.

5. The fabrication method for semiconductor devices of claim 1, wherein performing the photolithography on regions of each of at least two functional layers of the plurality of functional layers corresponding to the at least one marking label comprises performing the photolithography on regions of the respective metal layer of at least two functional layers of the plurality of functional layers corresponding to the marking label.

6. The fabrication method for semiconductor devices of claim 1, wherein performing the photolithography on regions of each of at least two functional layers of the plurality of functional layers corresponding to the at least one marking label comprises performing the photolithography on regions of a first functional layer and a second functional layer of the plurality of functional layers corresponding to the marking label, and wherein a third functional layer of the plurality of functional layers is sandwiched between the first functional layer and the second functional layer.

7. The fabrication method for semiconductor devices of claim 1, wherein the at least one marking label comprises a plurality of marking labels disposed around an outer rim on the primary surface of the wafer.

8. The semiconductor device of claim 3, wherein regions of each of at least two functional layers of the plurality of functional layers corresponding to the at least one marking label are photoetched.

9. The semiconductor devices of claim 3, wherein regions of the respective metal layer of at least two functional layers of the plurality of functional layers corresponding to the marking label are photoetched.

10. The semiconductor devices of claim 3, wherein regions of a first functional layer and a second functional layer of the plurality of functional layers corresponding to the marking label are photoetched, and wherein a third functional layer of the plurality of functional layers is sandwiched between the first functional layer and the second functional layer.

11. The semiconductor devices of claim 3, wherein the at least one marking label comprises a plurality of marking labels disposed around an outer rim on the primary surface of the wafer.

\* \* \* \* \*